(12) United States Patent
Wang et al.

(10) Patent No.: US 7,671,374 B2
(45) Date of Patent: Mar. 2, 2010

(54) LED CHIP PACKAGE STRUCTURE WITH A PLURALITY OF THICK GUIDING PINS AND A METHOD FOR MANUFACTURING THE SAME

(75) Inventors: Bily Wang, Hsinchu (TW); Jonnie Chuang, Taipei County (TW); Hui-Yen Huang, Hsin Chu (TW)

(73) Assignee: Harvatek Corporation, Hsinchu (TW)

( * ) Notice: Subject to any disclaimer, the term of this patent is extended or adjusted under 35 U.S.C. 154(b) by 42 days.

(21) Appl. No.: 11/861,757

(22) Filed: Sep. 26, 2007

(65) Prior Publication Data
US 2008/0179604 A1     Jul. 31, 2008

(30) Foreign Application Priority Data
Jan. 31, 2007    (TW) .............................. 96103612 A

(51) Int. Cl.
*H01L 29/205* (2006.01)
*H01L 23/495* (2006.01)
(52) U.S. Cl. ....................................... 257/91; 257/676
(58) Field of Classification Search ................. 257/676, 257/91, E33.058
See application file for complete search history.

(56) References Cited

U.S. PATENT DOCUMENTS

2005/0030762 A1*   2/2005   Kato et al. ................... 362/555
2007/0080438 A1*   4/2007   Yamanaka et al. .......... 257/676

OTHER PUBLICATIONS

M. Quirk, "Semiconductor Manufacturing Technology", 2001, Prentice Hall, pp. 323-325.*

* cited by examiner

*Primary Examiner*—Thomas L Dickey
*Assistant Examiner*—Nikolay Yushin
(74) *Attorney, Agent, or Firm*—Rosenberg, Klein & Lee

(57) ABSTRACT

An LED chip package structure with thick guiding pin includes a plurality of conductive pins separated from each other, an insulative casing, a plurality of LED chips, and a packaging colloid. The insulative casing covers a bottom side of each conductive pin to form an injection concave groove for exposing a top surface of each conductive pin. Two lateral sides of each conductive pin are extended outward from the insulative casing. The LED chips are arranged in the injection concave groove, and each LED chip has a positive electrode side and a negative electrode side respectively and electrically connected with different conductive pins. In addition, the packaging colloid is filled into the injection concave groove for covering the LED chips.

5 Claims, 20 Drawing Sheets

LED CHIP PACKAGE STRUCTURE WITH A PLURALITY OF THICK GUIDING PINS AND A METHOD FOR MANUFACTURING THE SAME

BACKGROUND OF THE INVENTION

1. Field of the Invention

The present invention relates to an LED chip package structure and a method for manufacturing the same, and particularly relates to an LED chip package structure with a plurality of thick guiding pins and a method for manufacturing the same.

2. Description of the Related Art

FIG. 1 shows a cross-sectional, schematic view of a vertical LED chip package structure of the prior art. The vertical LED chip package structure includes an insulative substrate 1a, a lead frame 2a, an LED chip 3a, and a fluorescent colloid 4a.

The lead frame 2a has two conductive pins 20a, 21a respectively extended along two opposite lateral sides and bent twice, so that the bottom faces of the two conductive pins 20a, 21a are electrically connected with a PCB 5a. In addition, the conductive pin 20a has a positive electrode area 200a, and the conductive pin 21a has a negative electrode area 210a.

Moreover, the LED chip 3a has a positive electrode side 300a and a negative electrode side 310a. The LED chip 3a is disposed on the conductive pin 20a directly, so that the positive electrode side 300a of the LED chip 3a is electrically connected with the positive electrode area 200a of the conductive pin 20a directly. The negative electrode side 310a of the LED chip 3a is electrically connected with the negative electrode area 210a of the conductive pin 21a via a leading wire 6a.

The fluorescent colloid 4a is covered on the LED chip 3a for protecting the LED chip 3a. Therefore, the vertical LED chip package structure should project light upwardly (such as the arrows in FIG. 1).

However, the vertical LED chip package structure of the prior art has some defects, as follows:

1. If the conductive pins (20a, 21a) want to electrically connect with the PCB 5a, the conductive pins (20a, 21a) need to be bent twice. Therefore, the complexity of the manufacturing process should be increased.

2. The thickness of the conductive pins (20a, 21a) is very thin, so that the heat-dissipating area of the conductive pins (20a, 21a) is very small. Therefore, the heat-dissipating capability cannot be promoted.

3. The thickness of the conductive pins (20a, 21a) is very thin, so that the supply of power source cannot be increased. Therefore, the LED chip cannot generate high light-emitting efficiency.

SUMMARY OF THE INVENTION

One particular aspect of the present invention is to provide an LED chip package structure with a plurality of thick guiding pins and a method for manufacturing the same. The present invention has some advantages, as follows:

1. The conductive pins can be electrically connected with the PCB without bending the conductive pins. Therefore, the manufacturing process of the present invention is simplification.

2. The thickness of the conductive pins is thick, so that the heat-dissipating area of the conductive pins is increased. Therefore, the heat-dissipating capability can be promoted in the present invention.

3. The thickness of the conductive pins is thick, so that the supply of power source can be increased. Therefore, the LED chip can generate high light-emitting efficiency.

In order to achieve the above-mentioned aspects, the present invention provides a method for manufacturing an LED chip package structure with a plurality of thick guiding pins, comprising: providing a metal substrate that has a plurality of conductive pins extended and suspended outward, wherein each conductive pin has a concave groove formed on a bottom surface thereof; covering a bottom side of each conductive pin with an insulative casing to form an injection concave groove for exposing a top side of each conductive pin; arranging a plurality of LED chips in the injection concave groove, wherein each LED chip has a positive electrode side and a negative electrode side respectively and electrically connected with different conductive pins; filling a package colloid into the injection concave groove for covering the LED chips; and cutting the conductive pins to form the LED chip package structure with the thick guiding pins.

In order to achieve the above-mentioned aspects, the present invention provides a method for manufacturing an LED chip package structure with a plurality of thick guiding pins, comprising: providing a metal substrate that has a plurality of conductive pins extended outward to fix two lateral sides of each conductive pin, wherein each conductive pin has a concave groove formed on a bottom surface thereof; covering a bottom side of each conductive pin with an insulative casing to form an injection concave groove for exposing a top side of each conductive pin; arranging a plurality of LED chips in the injection concave groove, wherein each LED chip has a positive electrode side and a negative electrode side respectively and electrically connected with different conductive pins; filling a package colloid into the injection concave groove for covering the LED chips; and cutting the conductive pins to form the LED chip package structure with the thick guiding pins.

In order to achieve the above-mentioned aspects, the present invention provides a method for manufacturing an LED chip package structure with a plurality of thick guiding pins, comprising: providing a metal substrate that has a plurality of conductive pins extended and suspended outward, and a plurality of strengthening ribs joint between each two conductive pins, wherein each conductive pin has a concave groove formed on a bottom surface thereof; covering a bottom side of each conductive pin with an insulative casing to form an injection concave groove for exposing a top side of each conductive pin; arranging a plurality of LED chips in the injection concave groove, wherein each LED chip has a positive electrode side and a negative electrode side respectively and electrically connected with different conductive pins; filling a package colloid into the injection concave groove for covering the LED chips; and cutting the conductive pins to form the LED chip package structure with the thick guiding pins.

In order to achieve the above-mentioned aspects, the present invention provides an LED chip package structure with a plurality of thick guiding pins, comprising: a plurality of conductive pins, an insulative casing, a plurality of LED chips, and a packaging colloid. The conductive pins are separated from each other. The insulative casing covers a bottom side of each conductive pin to form an injection concave groove for exposing a top surface of each conductive pin. The LED chips are arranged in the injection concave groove, and each LED chip has a positive electrode side and a negative electrode side respectively and electrically connected with different conductive pins. The packaging colloid is filled into the injection concave groove for covering the LED chips.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Referring to FIGS. 2 to 5, the first embodiment of the present invention provides a method for manufacturing an LED chip package structure with a plurality of thick guiding pins.

Figure 1:
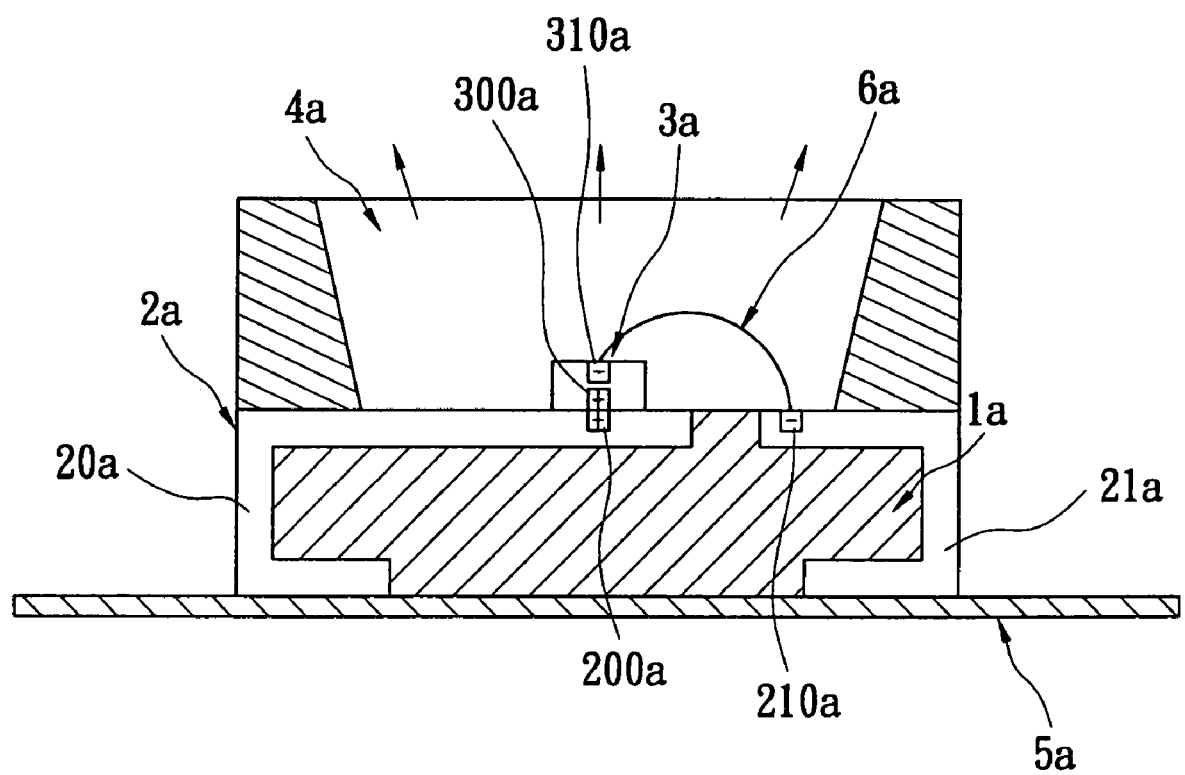
FIG. 1 is a cross-sectional, schematic view of a vertical LED chip package structure of the prior art.
Figure 2:
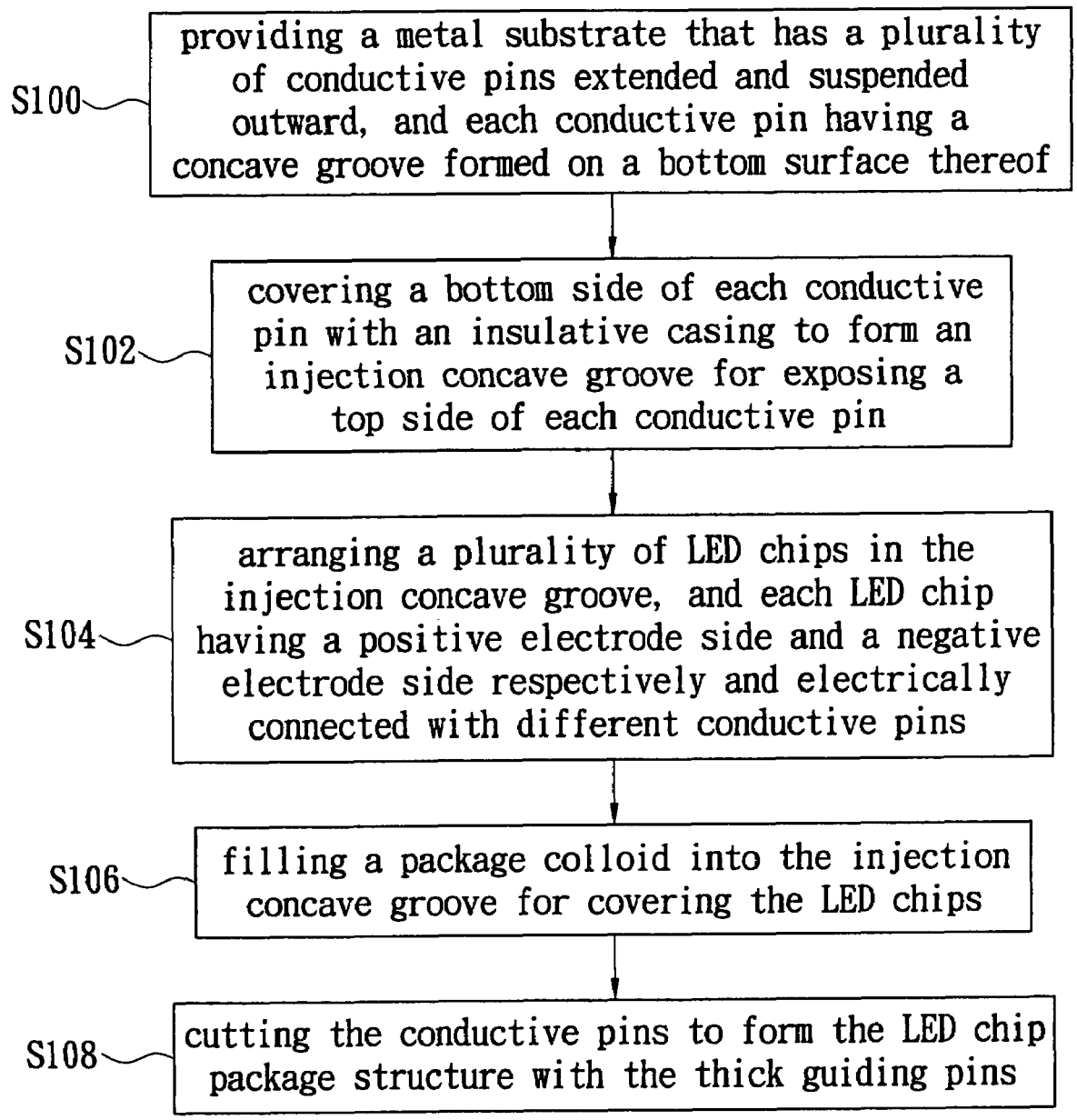
FIG. 2 is a flowchart of a method for manufacturing an LED chip package structure with a plurality of thick guiding pins according to the first embodiment of the present invention.
Figure 3:
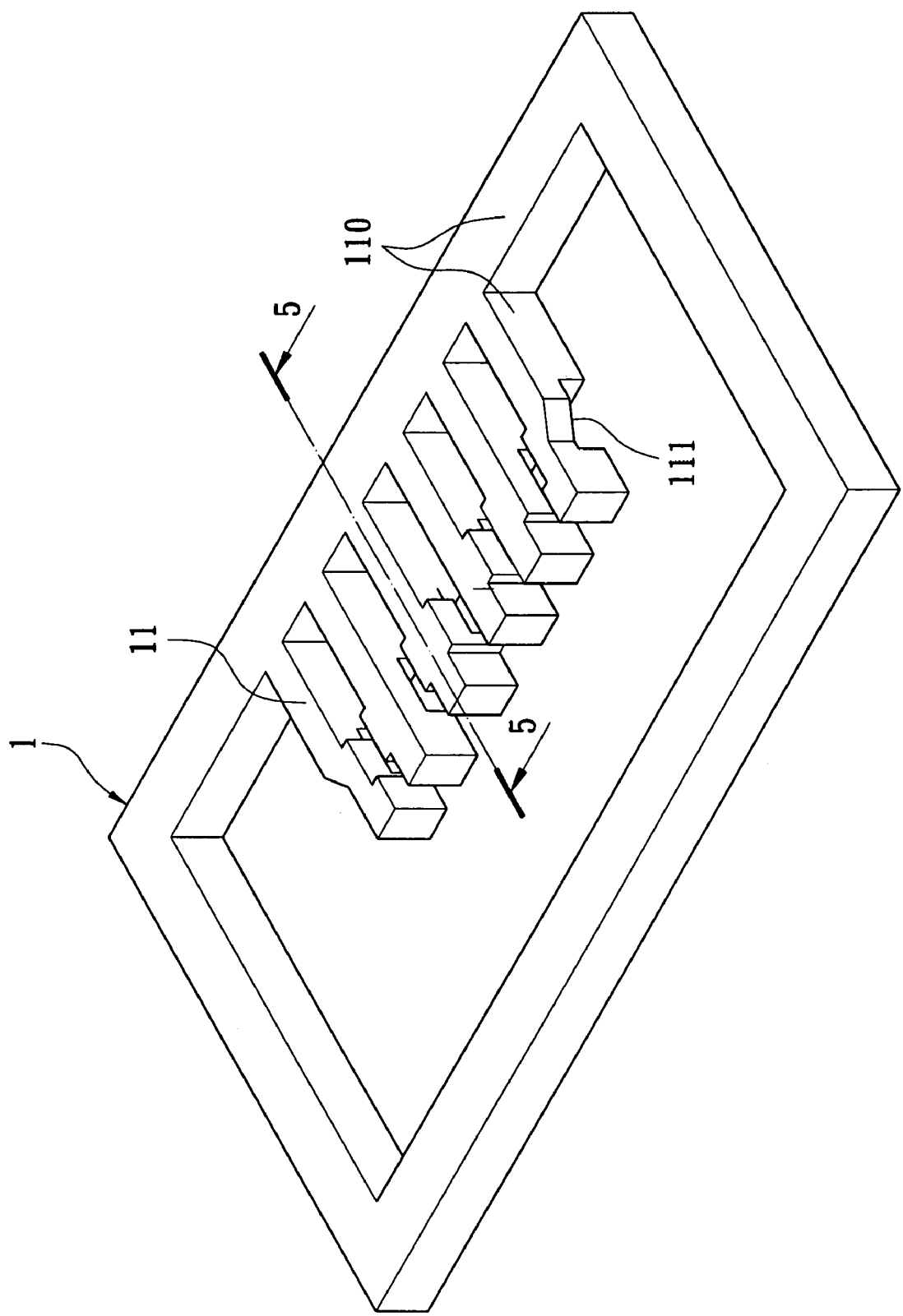
FIG. 3 is a perspective, schematic view of a metal substrate according to the first embodiment of the present invention.
Figure 4:
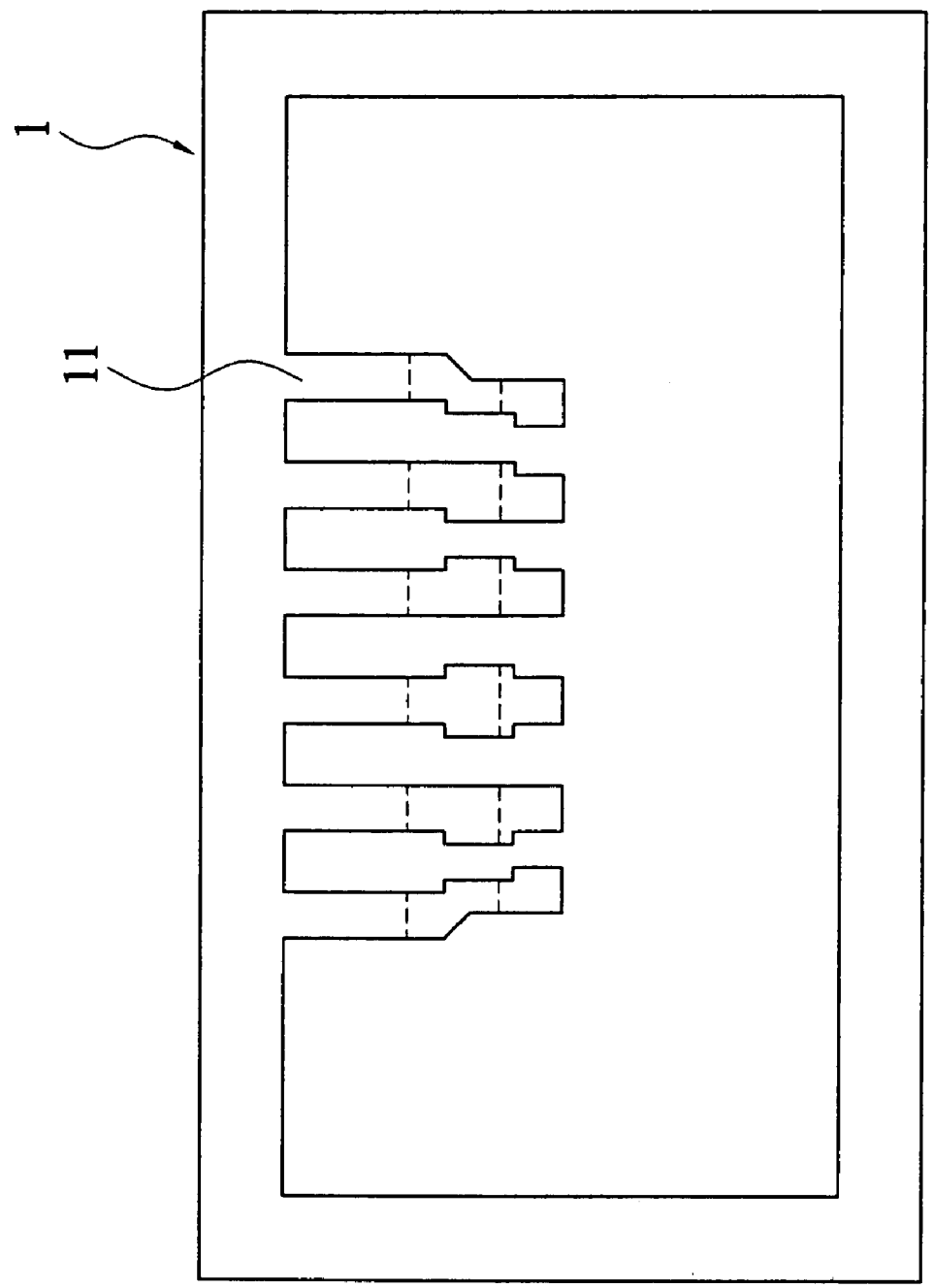
FIG. 4 is a top, schematic view of a metal substrate according to the first embodiment of the present invention.
Figure 5:
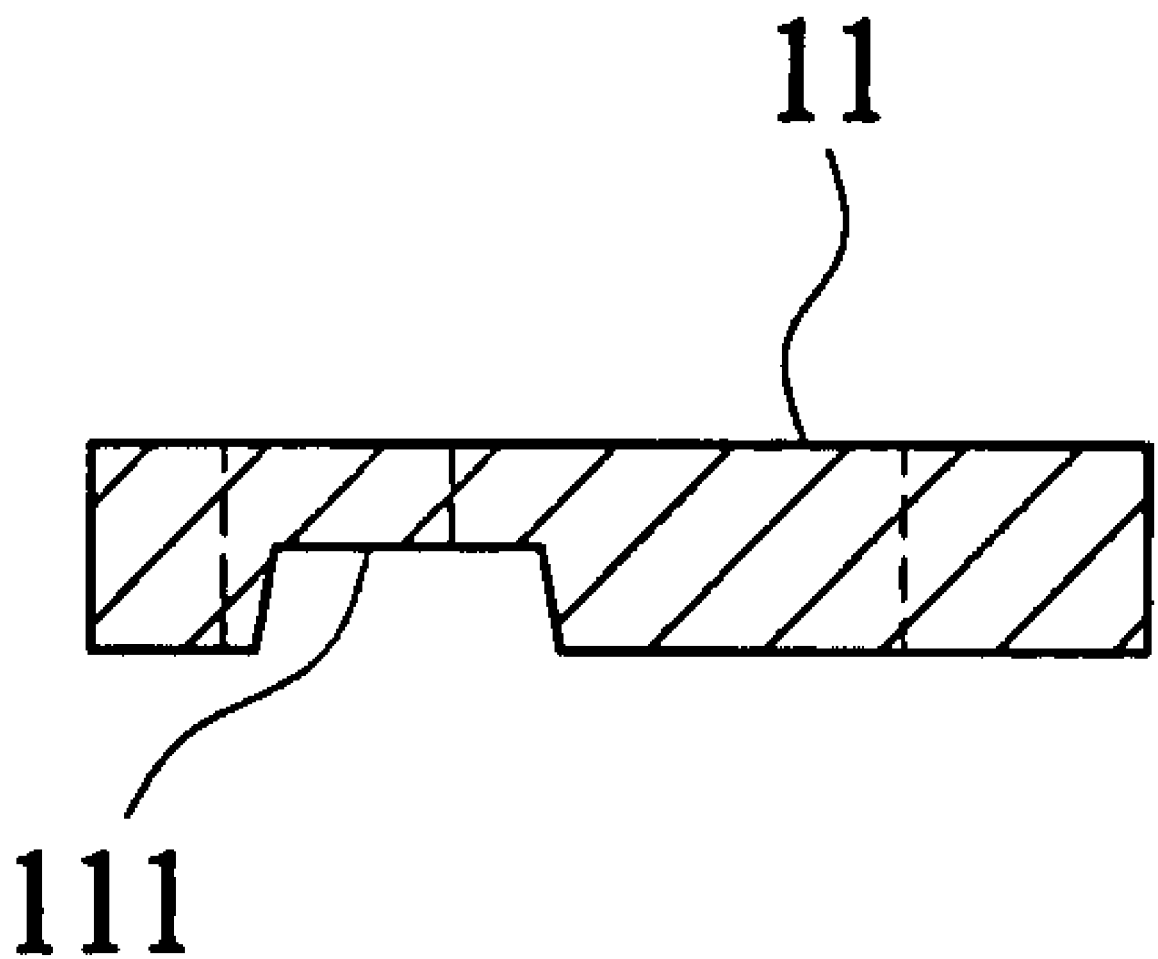
FIG. 5 is a cross-sectional view along line 5-5 of a metal substrate shown in FIG. 2.

The method comprises: firstly, referring to FIG. 3, providing a metal substrate 1 that has a plurality of conductive pins 11 extended and suspended outward, and each conductive pin 11 having a concave groove 111 formed on a bottom surface thereof (S100). The conductive pins 11 are separated from each other. Each concave groove 111 can be a half etching concave groove. The metal substrate 1 and the conductive pins 11 are formed via an etching method, a punching method, or any forming method. The metal substrate 1 has an electroplated protection layer 110 formed on a surface thereof. It means that each conductive pin 11 has an electroplated protection layer 110 formed on a surface thereof. In addition, each conductive pin 11 has a thickness between 0.4 mm and 3 mm. Of course, the thickness of each conductive pin 11 should be more than 0.4 mm according to user's requirement.

Figure 6:
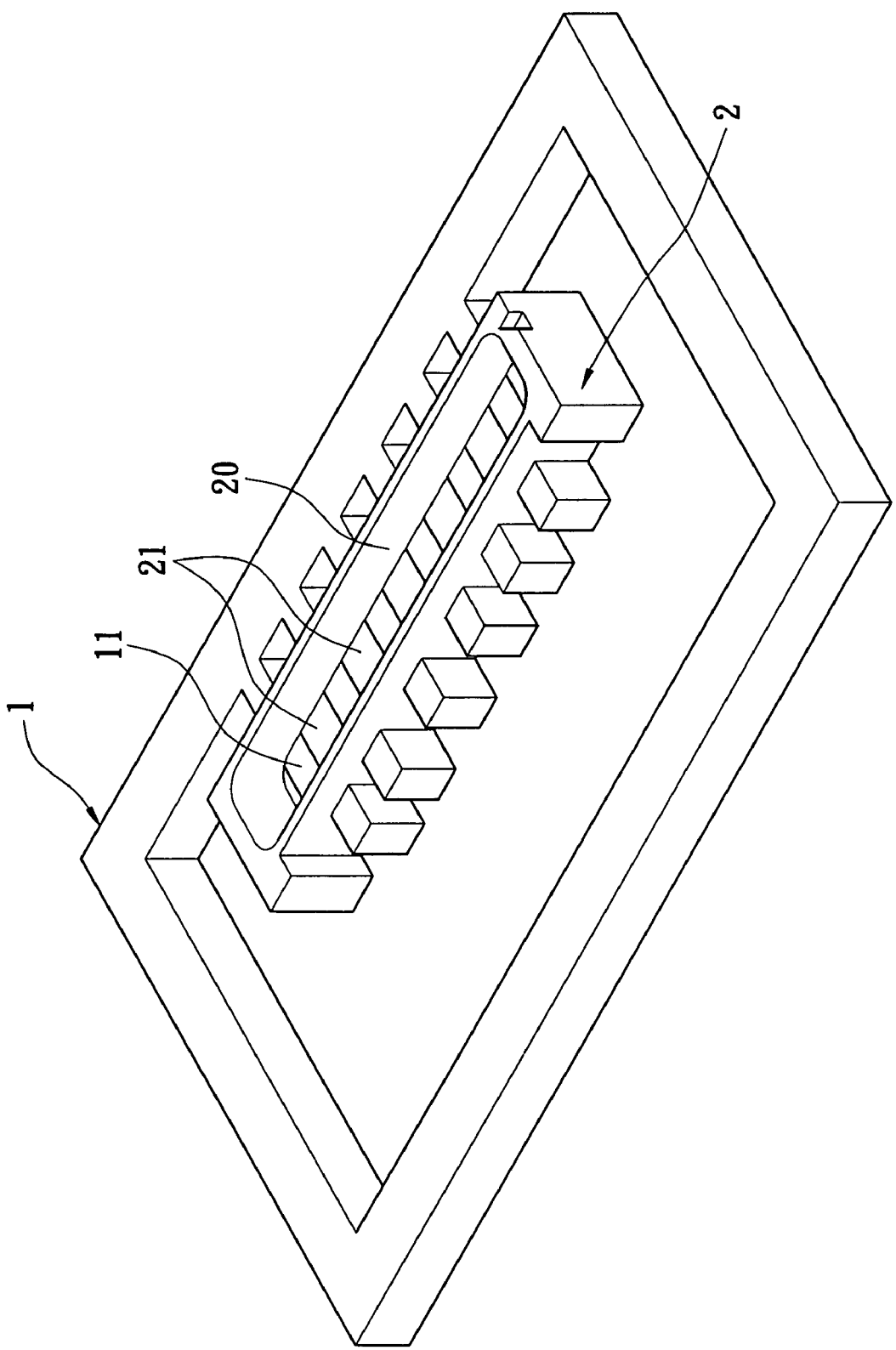
FIG. 6 is a perspective, schematic view of a metal substrate being covered with an insulative casing according to the first embodiment of the present invention.

Referring to FIG. 6, after the step of S100, the method further comprises: covering a bottom side of each conductive pin 11 with an insulative casing 2 to form an injection concave groove 20 for exposing a top side of each conductive pin 11 (S102). The insulative casing 2 is filled into a plurality of non-conductive areas 21 between each two conductive pins 11. In the step of S102, the bottom sides of the conductive pins 11 are covered with the insulative casing 2 via an injection molding method or any forming method.

Figure 7:
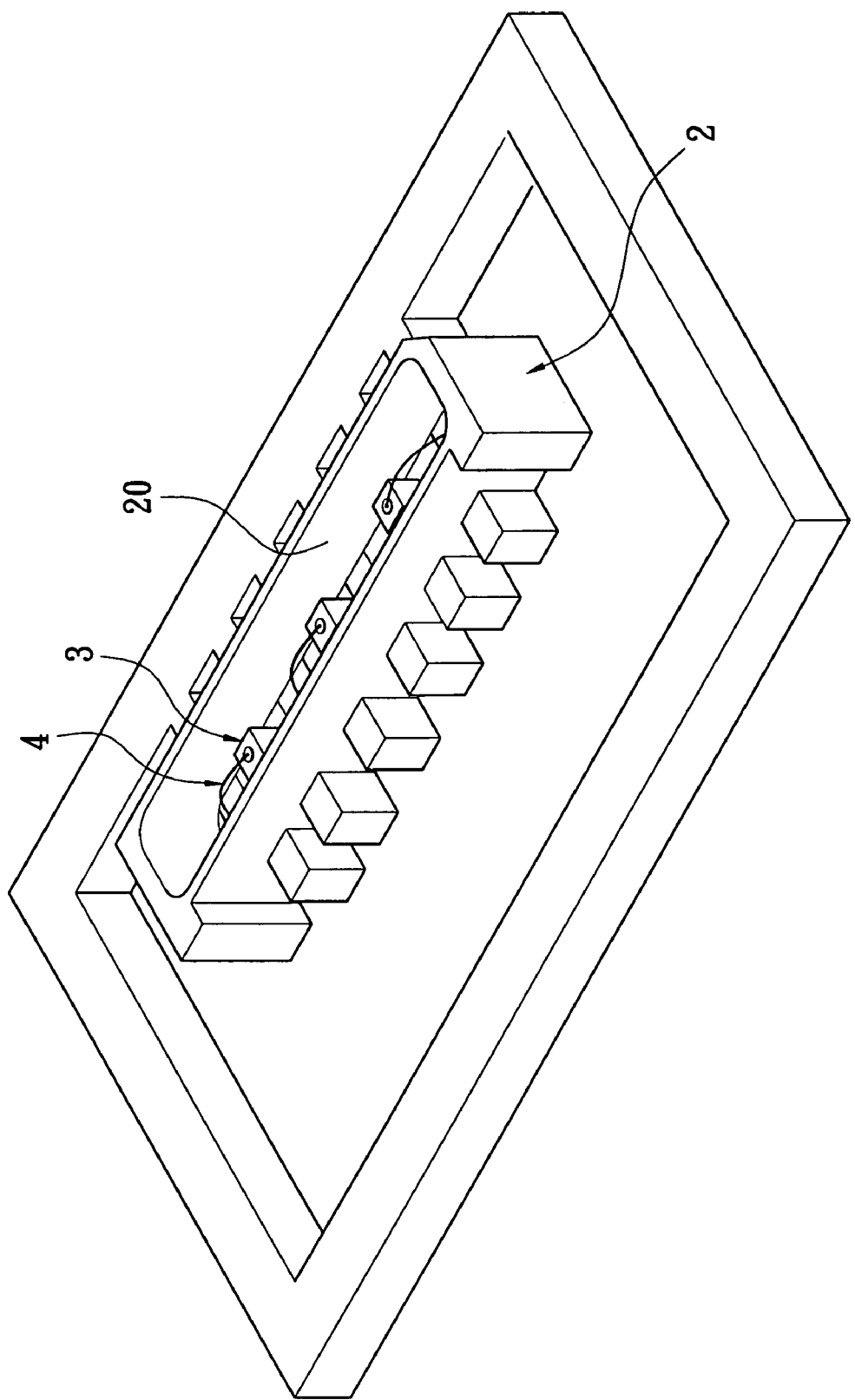
FIG. 7 is a perspective, schematic view of a plurality of LED chips respectively and electrically connected with a plurality of conductive pins according to the first embodiment of the present invention.
Figure 8:
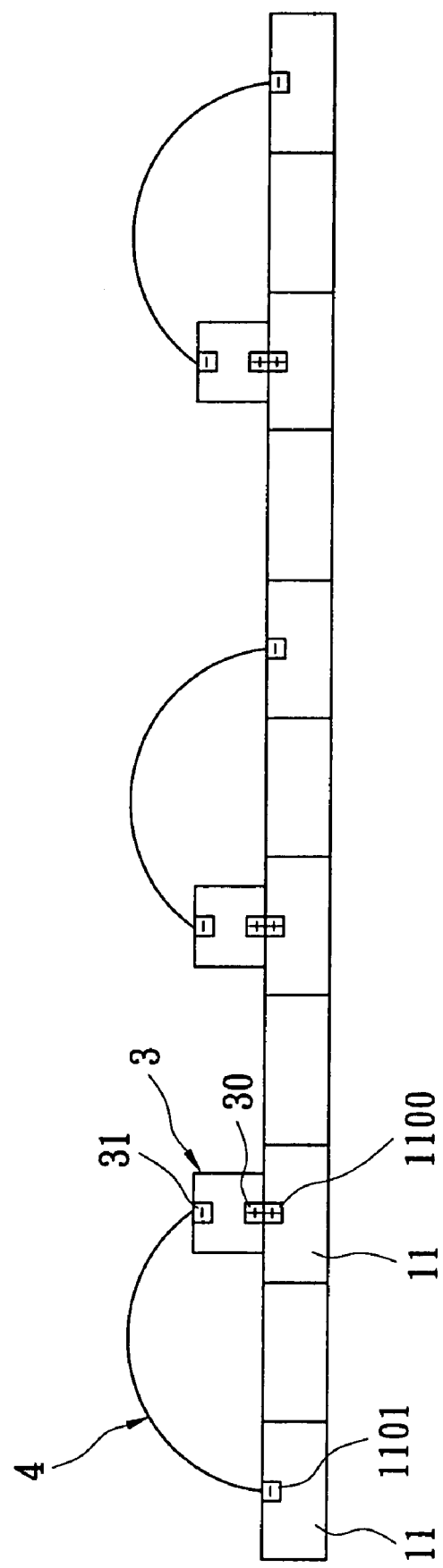
FIG. 8 is a lateral, schematic view of a first arrangement of a plurality of LED chips according to the present invention.

Referring to FIGS. 7 and 8, after the step of S102, the method further comprises: arranging a plurality of LED chips 3 in the injection concave groove 20, and each LED chip 3 having a positive electrode side 30 and a negative electrode side 31 respectively and electrically connected with different conductive pins 11 (S104).

In other words, the positive electrode side 30 and the negative electrode side 31 of each LED chip 3 are respectively and selectively arranged on a lower surface and an upper surface of each LED chip 3. Each LED chip 3 is arranged on a corresponding positive electrode portion 1100. Therefore, the positive electrode side 1100 of each LED chip 3 is directly and electrically connected with the corresponding positive electrode portion 1100, and the negative electrode side 31 of each LED chip 3 is electrically connected with a corresponding negative electrode portion 1101 via a leading wire 4.

Figure 9:
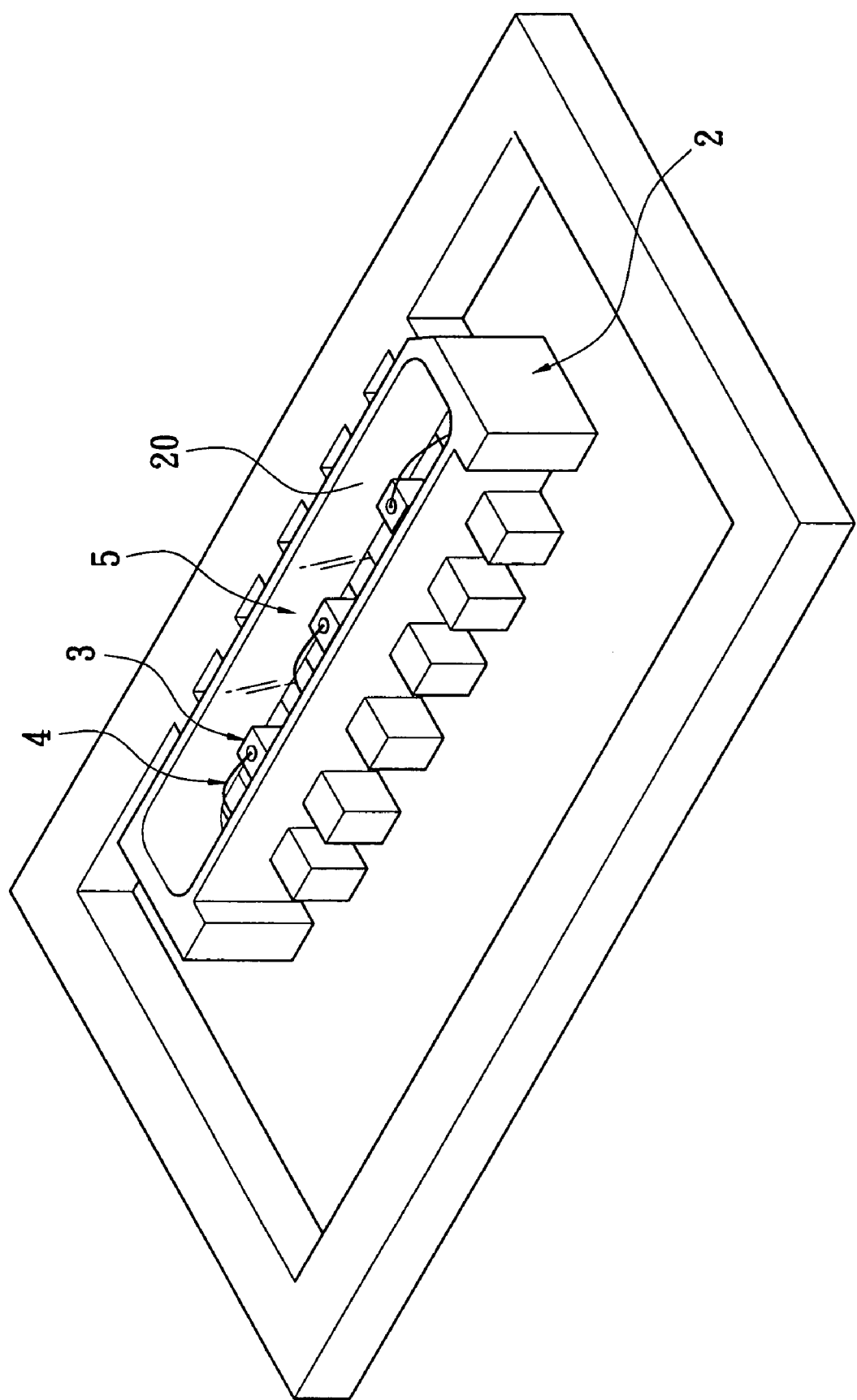
FIG. 9 is a perspective, schematic view of a package colloid filled into an injection concave groove according to the first embodiment of the present invention.

Referring to FIG. 9, after the step of S104, the method further comprises: filling a package colloid 5 into the injection concave groove 20 for covering the LED chips 3 (S106). The package colloid 5 can be made of an epoxy material or a silicone material.

Figure 10:
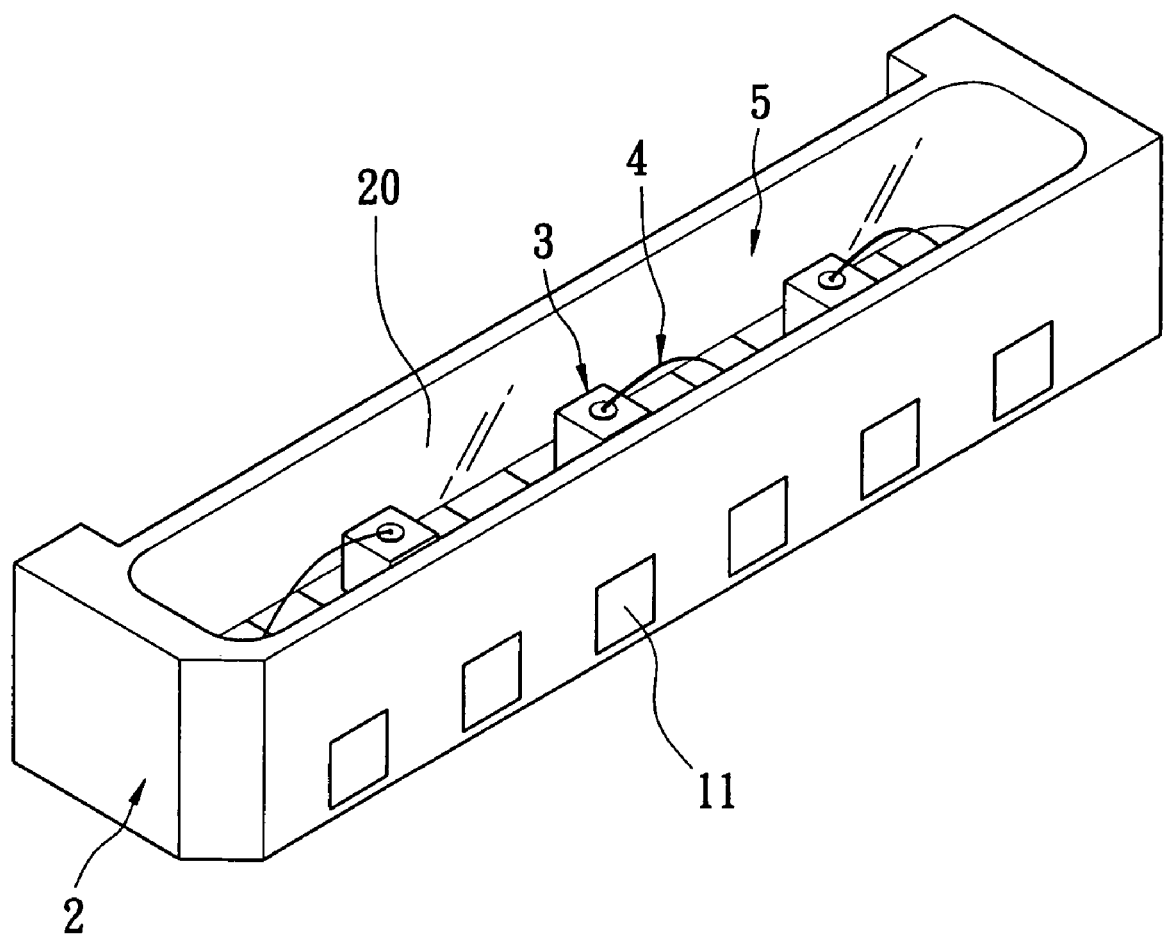
FIG. 10 is one perspective, schematic view of one part of each conductive pin being cut according to the first embodiment of the present invention.
Figure 11:
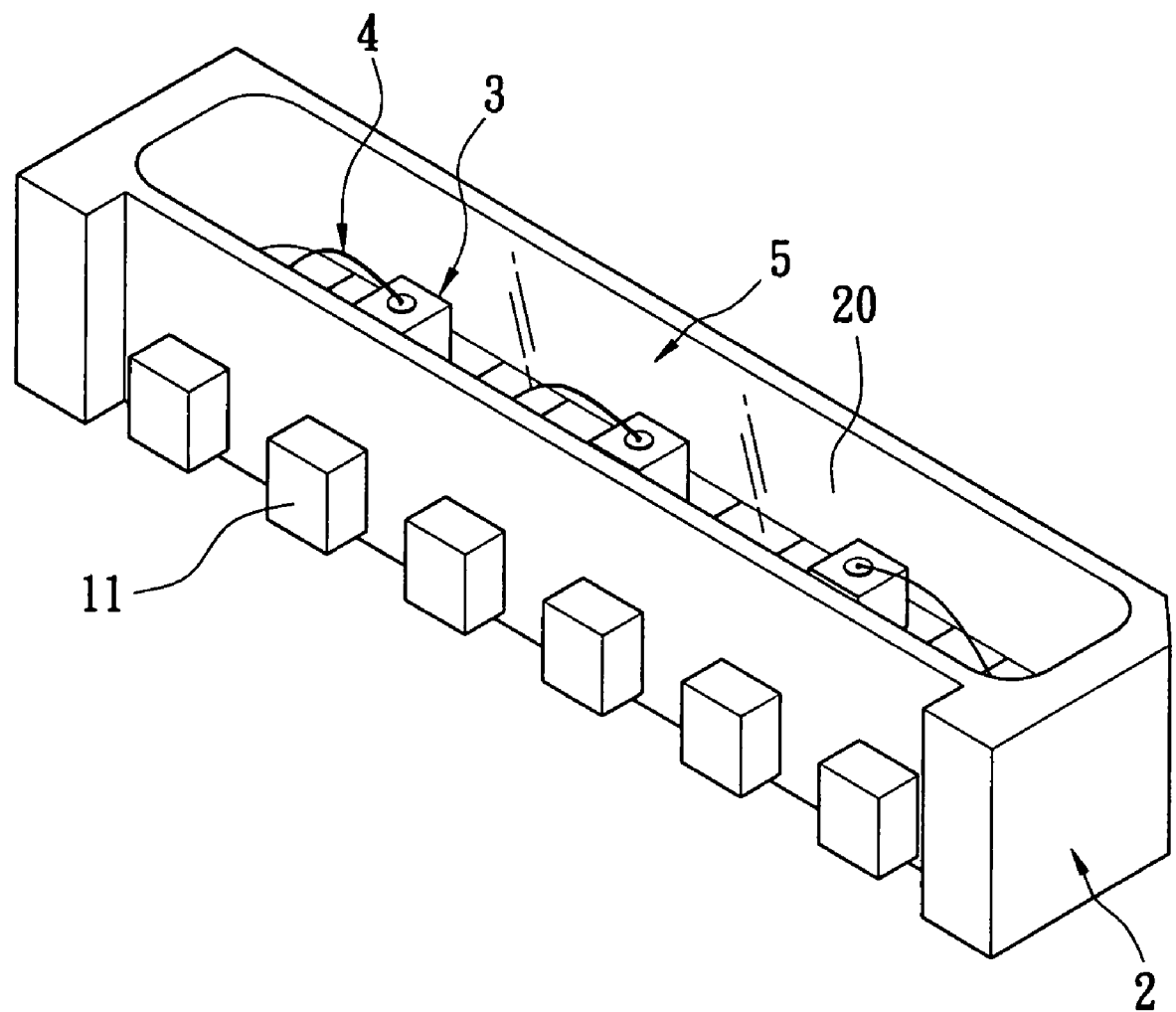
FIG. 11 is another perspective, schematic view of one part of each conductive pin being cut according to the first embodiment of the present invention.

Referring to FIGS. 10 and 11, after the step of S106, the method further comprises: cutting the conductive pins 11 to form the LED chip package structure with the thick guiding pins (S108). Therefore, two lateral sides of each conductive pin 11 are appeared from two lateral sides of the insulative casing 2 for soldering process.

Figure 12:
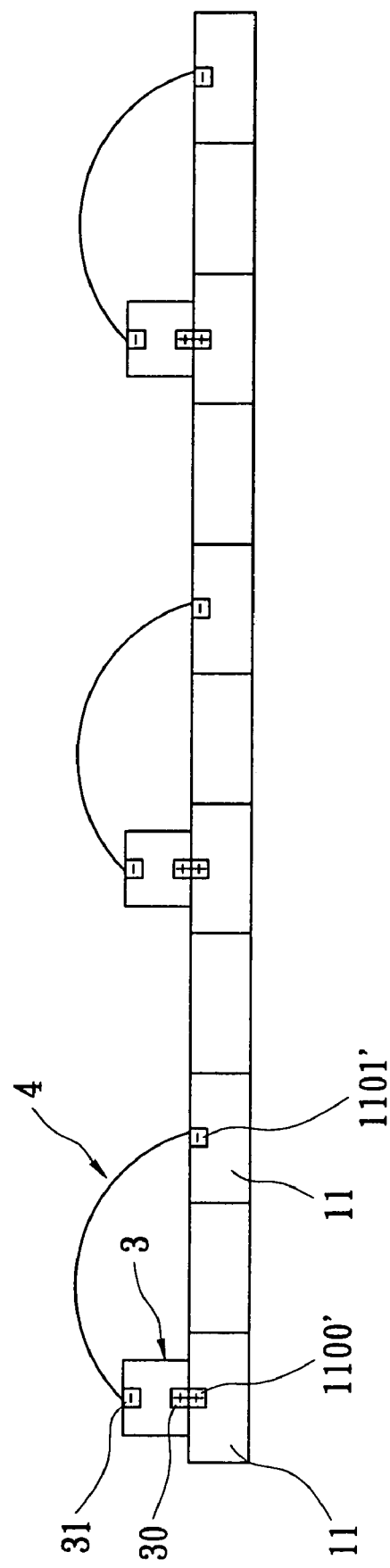
FIG. 12 is a lateral, schematic view of a second arrangement of a plurality of LED chips according to the present invention.

Referring to FIG. 12, the positive electrode side 30 and the negative electrode side 31 of each LED chip 3 are respectively and sequentially arranged on a lower surface and an upper surface of each LED chip 3. Each LED chip 3 is arranged on a corresponding positive electrode portion 1100'. Therefore, the positive electrode side 1100' of each LED chip 3 is directly and electrically connected with the corresponding positive electrode portion 1100', and the negative electrode side 31 of each LED chip 3 is electrically connected with a corresponding negative electrode portion 1101' via a leading wire 4.

Figure 13:
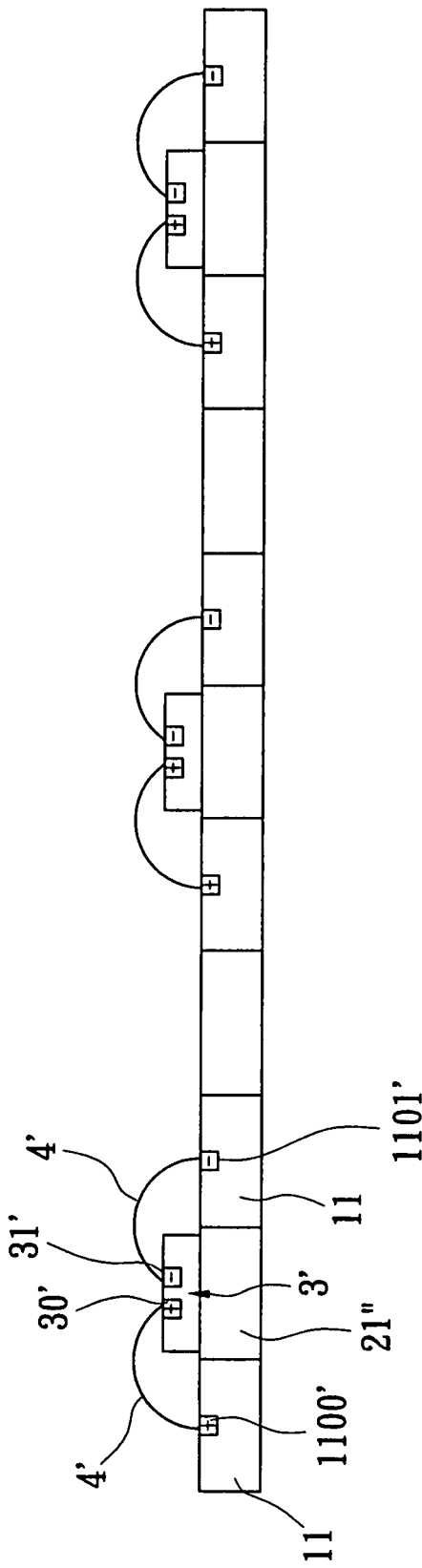
FIG. 13 is a lateral, schematic view of a third arrangement of a plurality of LED chips according to the present invention.

Referring to FIG. 13, the insulative casing 2 further comprises a plurality of non-conductive areas 21' between each two conductive pins 11. Moreover, a positive electrode side 30' and a negative electrode side 31' of each LED chip 3' are arranged on an upper surface of each LED chip 3'. Each LED chip 3' is separately arranged on each non-conductive area 21'. Therefore, the positive electrode side 30' and the negative electrode side 31' of each LED chip 3' are respectively and electrically connected with the adjacent positive and negative electrode portions 1100', 1101' via two leading wires 4' by a wire-bounding method.

Figure 14:
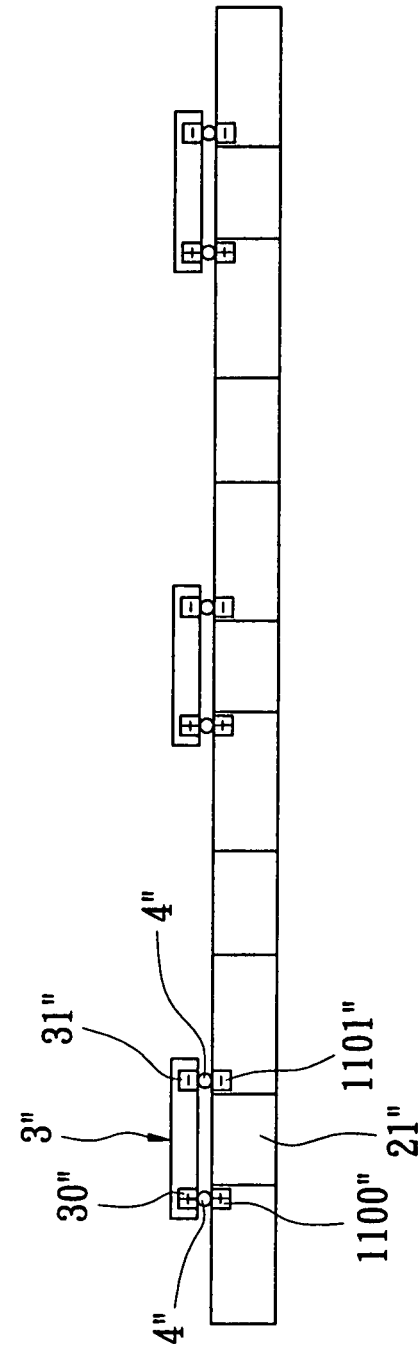
FIG. 14 is a lateral, schematic view of a fourth arrangement of a plurality of LED chips according to the present invention.

Referring to FIG. 14, a positive electrode side 30" and a negative electrode side 31" of each LED chip 3" are arranged on a lower surface of each LED chip 3". Each LED chip 3" crosses through a corresponding non-conductive area 21". Therefore, the positive electrode side 30" and the negative electrode side 31" of each LED chip 3," are respectively and electrically connected with the adjacent positive and negative electrode portions 1100", 1101" via a plurality of solder balls 4" by a flip-chip method.

Figure 15:
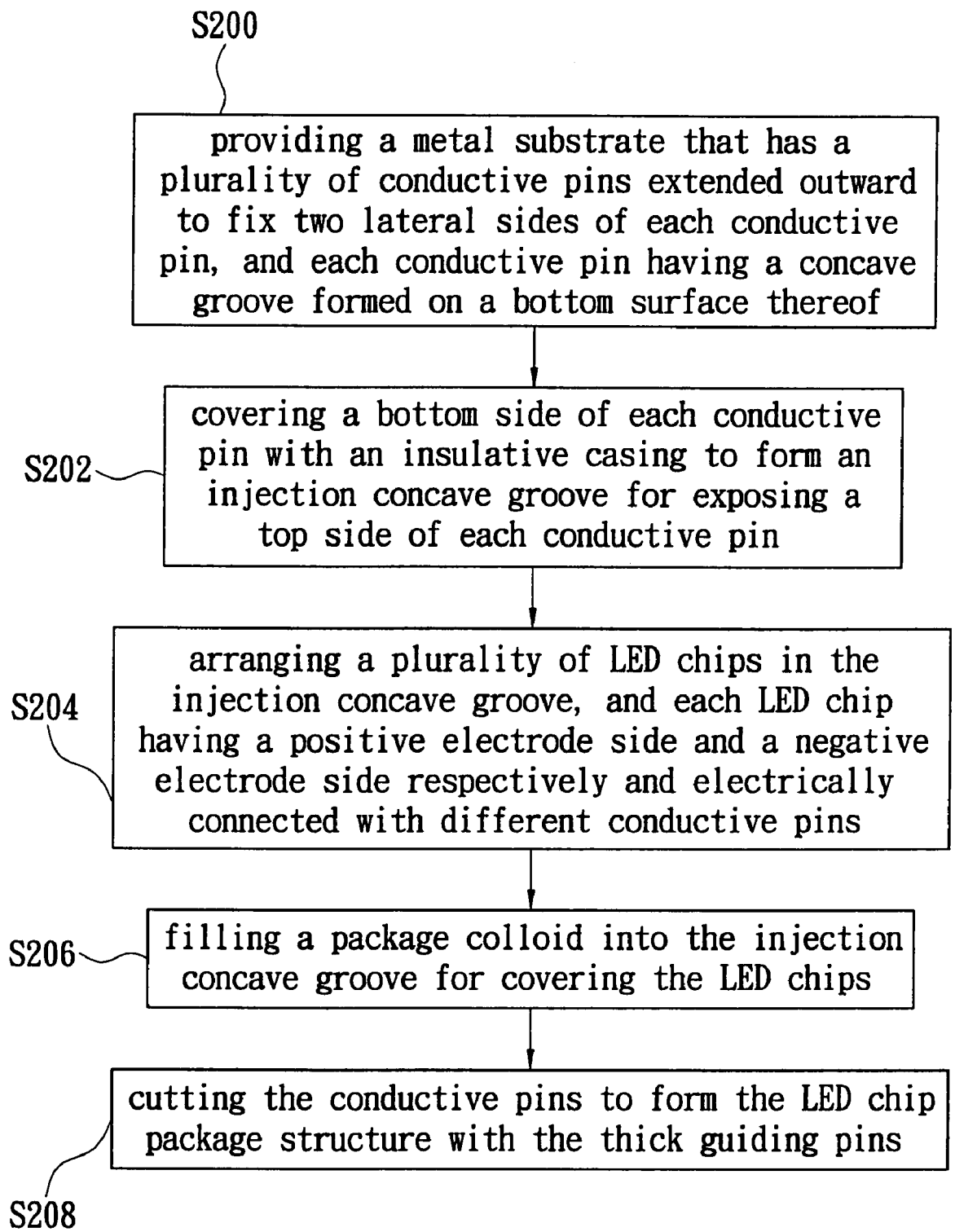
FIG. 15 is a flowchart of a method for manufacturing an LED chip package structure with a plurality of thick guiding pins according to the second embodiment of the present invention.
Figure 16:
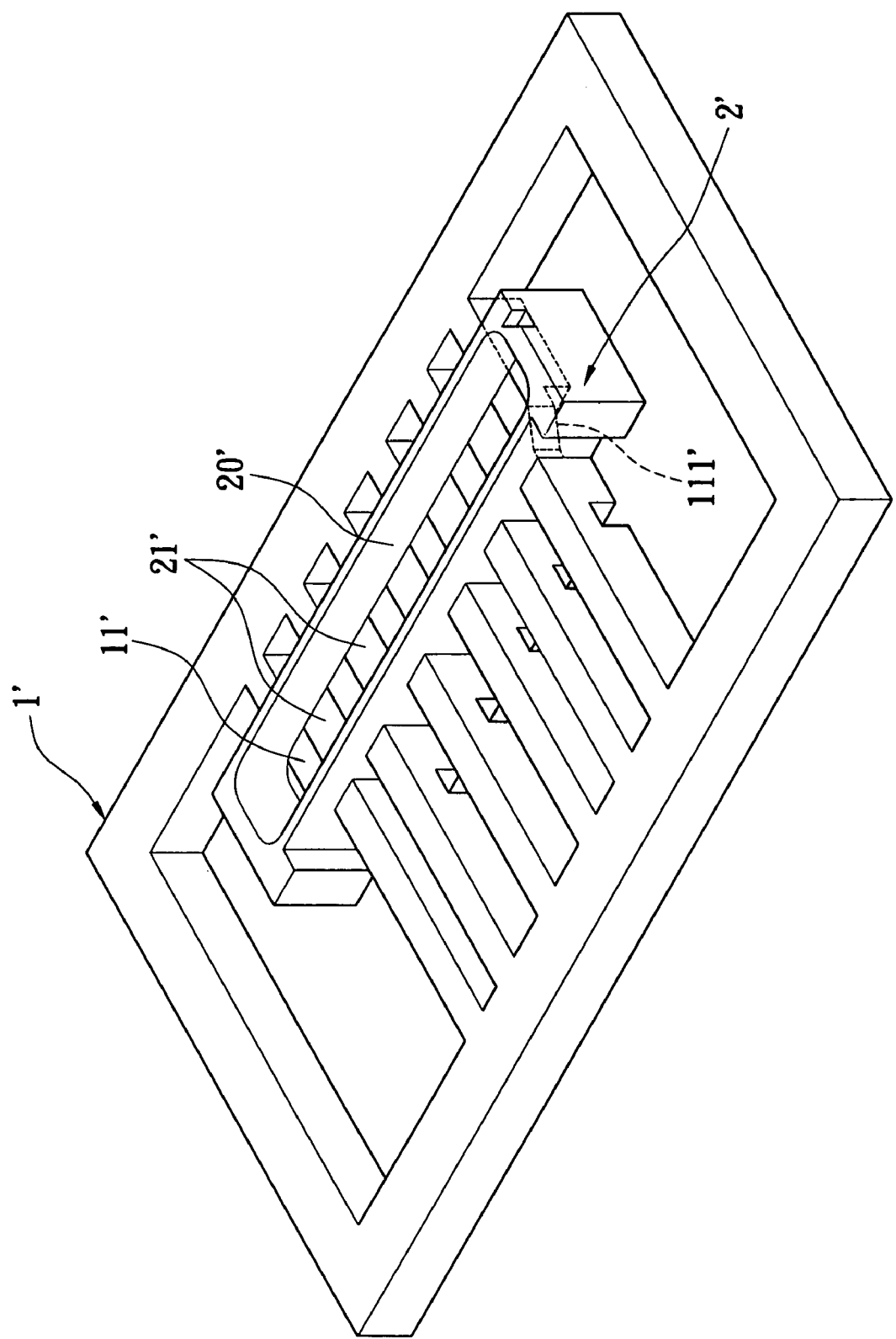
FIG. 16 is a perspective, schematic view of a metal substrate being covered with an insulative casing according to the second embodiment of the present invention.

Referring to FIGS. 15 and 16, the second embodiment of the present invention provides a method for manufacturing an LED chip package structure with a plurality of thick guiding pins. The method comprises: firstly, referring to FIG. 16, providing a metal substrate 1' that has a plurality of conductive pins 11' extended outward to fix two lateral sides of each conductive pin 11', and each conductive pin 11' having a concave groove 111' formed on a bottom surface thereof (S200). Each concave groove 111' can be a half etching concave groove. After the step of S200, the method further comprises: covering a bottom side of each conductive pin 11' with an insulative casing 2' to form an injection concave groove 20' for exposing a top side of each conductive pin 11' (S202). The insulative casing 2' is filled into a plurality of non-conductive areas 21' between each two conductive pins 11'.

Furthermore, the next steps of the second embodiment are same as the steps of S104 to S108 in the first embodiment. Therefore, the method further comprises: arranging a plurality of LED chips (not shown) in the injection concave groove 20', and each LED chip having a positive electrode side and a negative electrode side respectively and electrically connected with different conductive pins 11' (S204); filling a package colloid (not shown) into the injection concave groove 20' for covering the LED chips (S206); and then cutting the conductive pins 11' to form the LED chip package structure with the thick guiding pins (S208).

Figure 17:
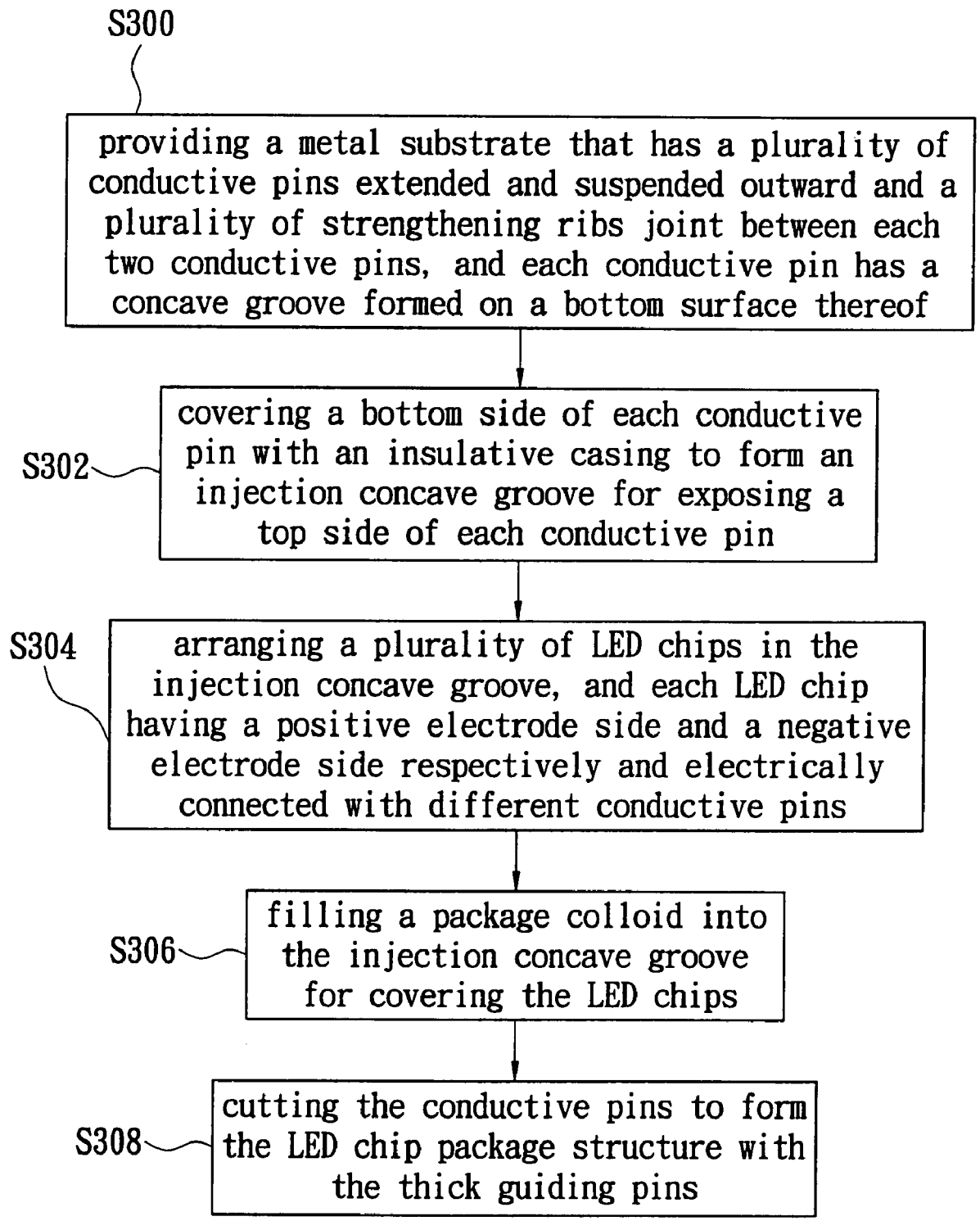
FIG. 17 is a flowchart of a method for manufacturing an LED chip package structure with a plurality of thick guiding pins according to the third embodiment of the present invention.
Figure 18:
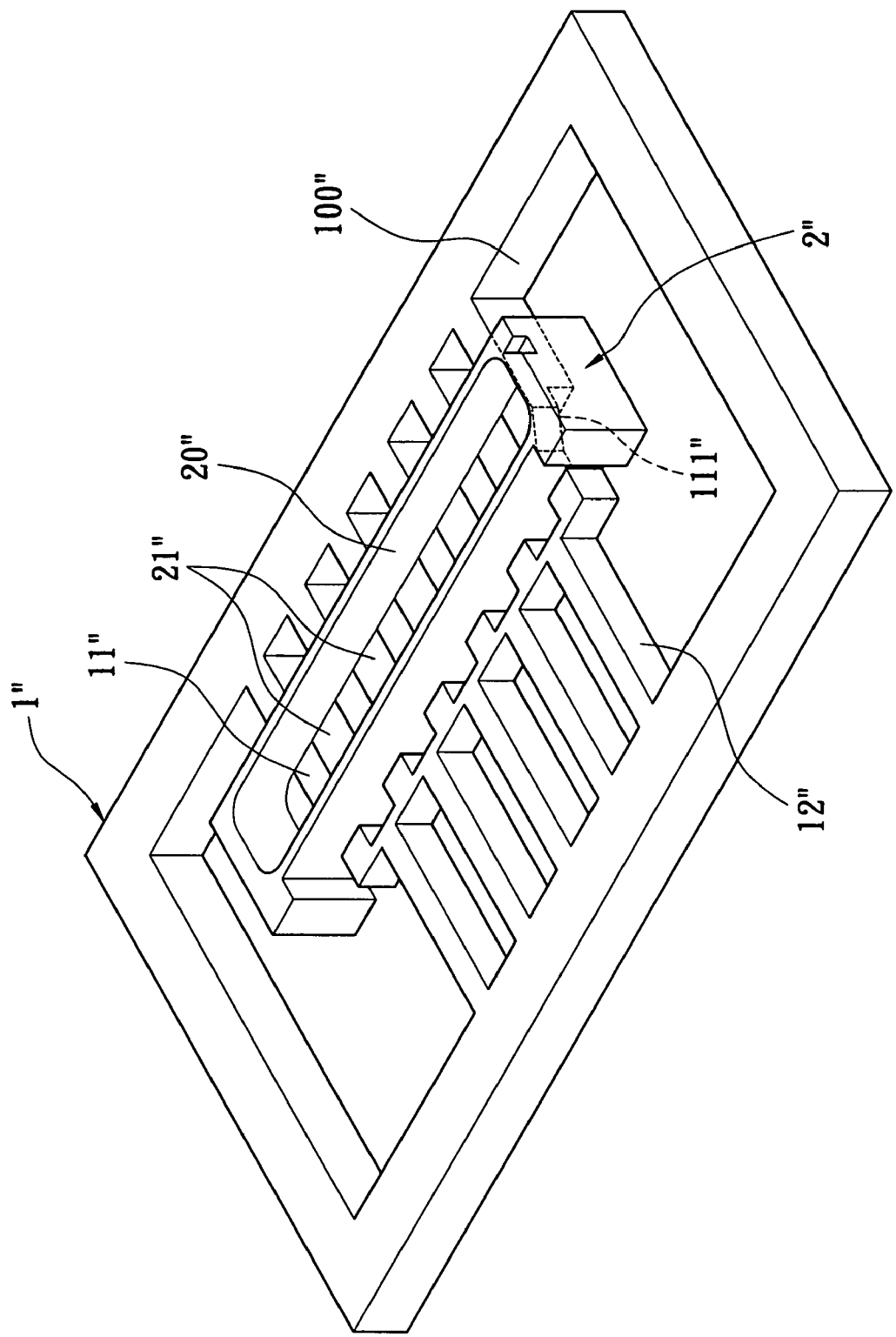
FIG. 18 is a perspective, schematic view of a metal substrate being covered with an insulative casing according to the third embodiment of the present invention.

Referring to FIGS. 17 and 18, the third embodiment of the present invention provides a method for manufacturing an LED chip package structure with a plurality of thick guiding pins. The method comprises: firstly, referring to FIG. 18, providing a metal substrate 1" that has a plurality of conductive pins 11" extended and suspended outward and a plurality of strengthening ribs 12" joint between each two conductive pins 11", and each conductive pin 11" has a concave groove 111" formed on a bottom surface thereof (S300). Each concave groove 111" can be a half etching concave groove. After the step of S300, the method further comprises: covering a bottom side of each conductive pin 11" with an insulative casing 2" to form an injection concave groove 20" for exposing a top side of each conductive pin 11" (S302). The insulative casing 2" is filled into a plurality of non-conductive areas 21" between each two conductive pins 11".

Furthermore, the next steps of the second embodiment are same as the steps of S204 to S208 in the first embodiment. Therefore, the method further comprises: arranging a plurality of LED chips (not shown) in the injection concave groove 20", and each LED chip having a positive electrode side and a negative electrode side respectively and electrically connected with different conductive pins 11" (S304); filling a package colloid (not shown) into the injection concave groove 20" for covering the LED chips (S306); and then cutting the conductive pins 11" to form the LED chip package structure with the thick guiding pins (S308).

Figure 19:
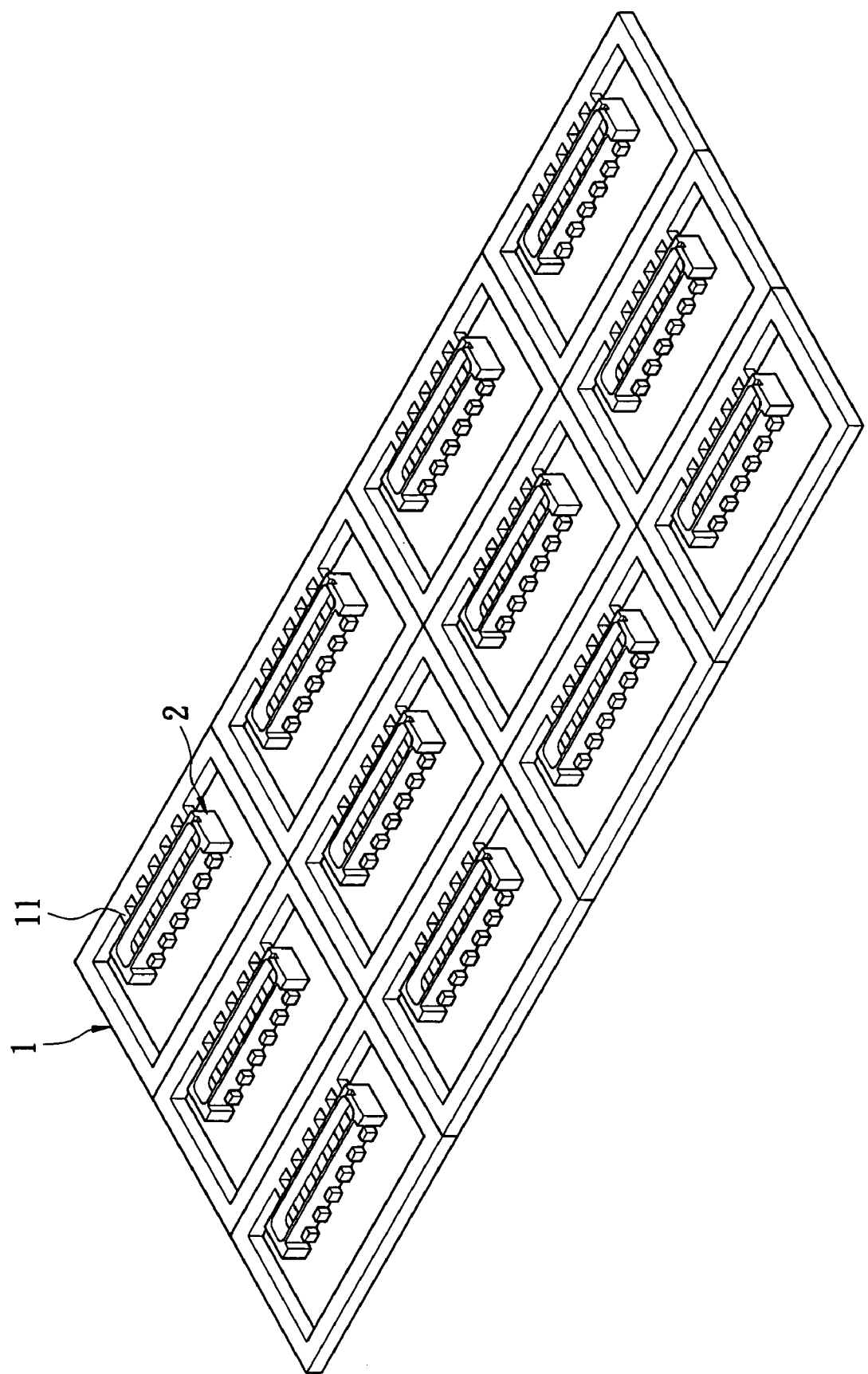
FIG. 19 is a perspective, schematic view of a metal substrate being covered with a plurality of insulative casings according to the first embodiment of the present invention.
Figure 20:
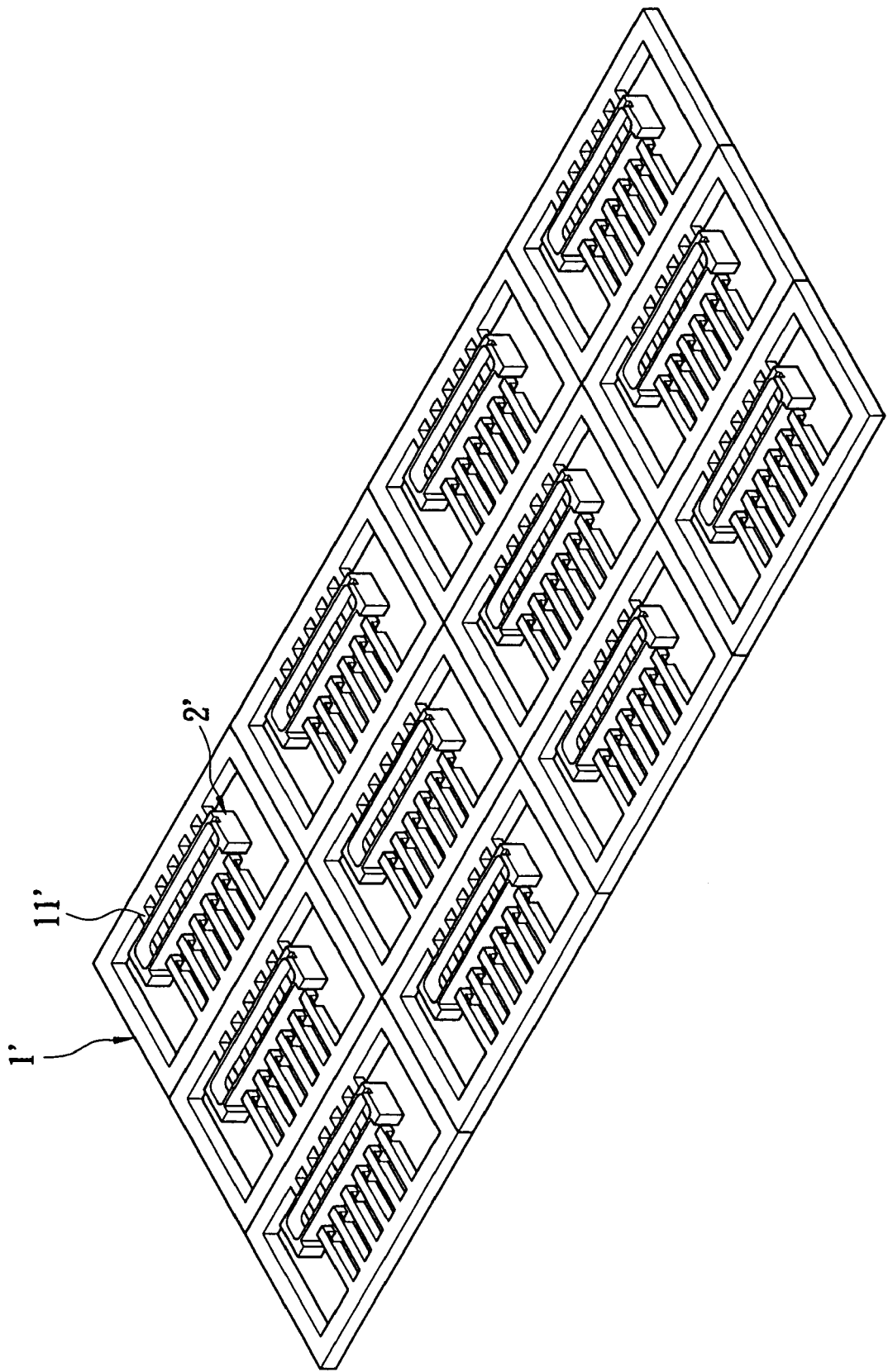
FIG. 20 is a perspective, schematic view of a metal substrate being covered with a plurality of insulative casings according to the second embodiment of the present invention.
Figure 21:
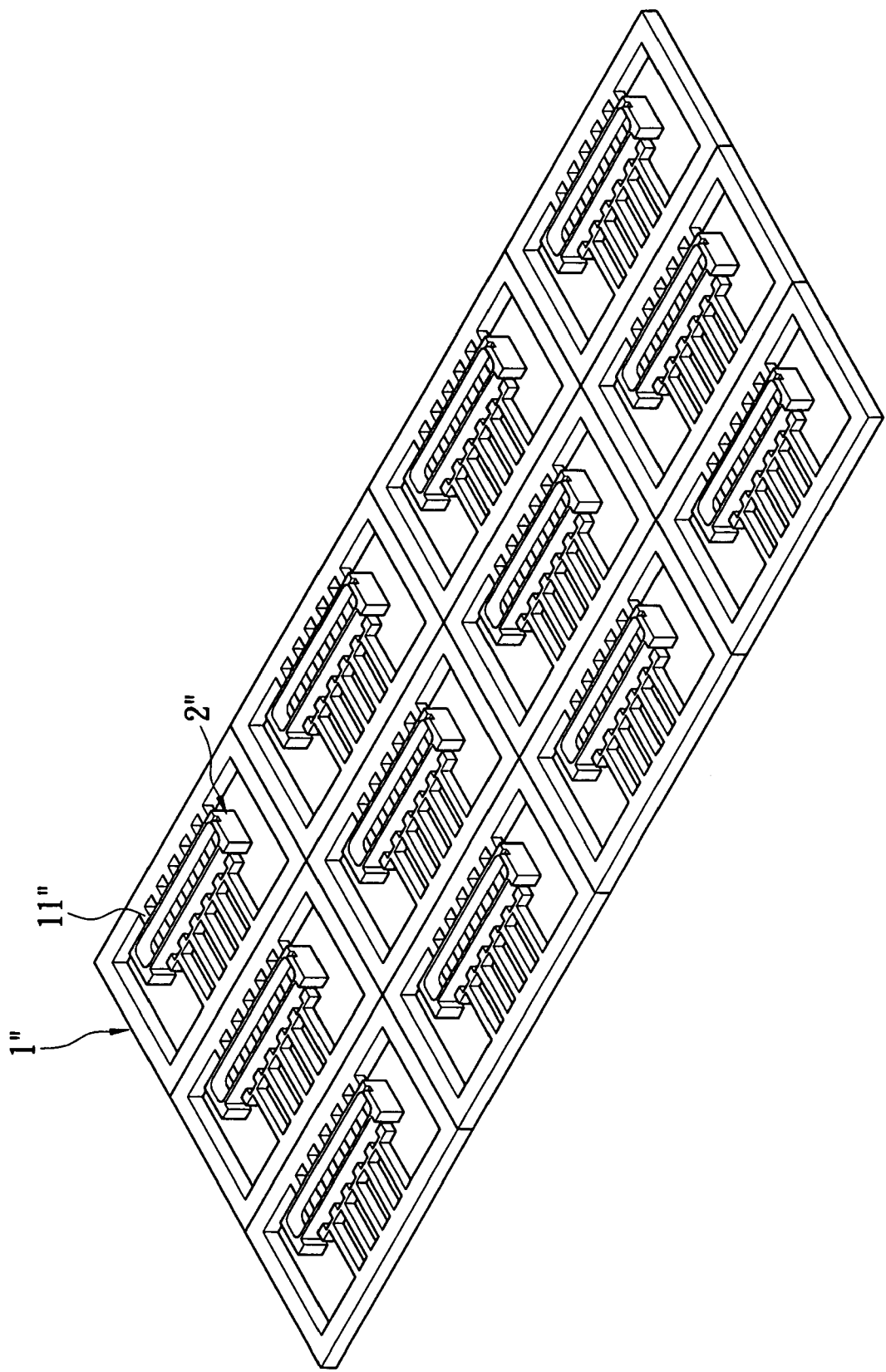
FIG. 21 is a perspective, schematic view of a metal substrate being covered with a plurality of insulative casings according to the third embodiment of the present invention.

FIGS. 19 to 21 show three perspective, schematic views of a metal substrate being covered with a plurality of insulative casings according to the first, the second and the third embodiment of the present invention, respectively. Referring to FIG. 19, a metal substrate 1 with a plurality of conductive pins 11 is covered with a plurality of insulative casings 2 to form three rows of series LED chip package structure. Referring to FIG. 20, a metal substrate 1' with a plurality of conductive pins 11' is covered with a plurality of insulative casings 2' to form three rows of series LED chip package structure. Referring to FIG. 21, a metal substrate 1" with a plurality of conductive pins 11" is covered with a plurality of insulative casings 2" to form three rows of series LED chip package structure. Therefore, the three types of conductive pins (11, 11', 11") and insulative casings (2, 2', 2") can be integratedly formed in one piece.

In conclusion, the present invention has some advantages, as follows:

1. The conductive pins can be electrically connected with the PCB without bending the conductive pins. Therefore, the manufacturing process of the present invention is simplification.

2. The thickness of the conductive pins is thick, so that the heat-dissipating area of the conductive pins is increased. Therefore, the heat-dissipating capability can be promoted in the present invention.

3. The thickness of the conductive pins is thick, so that the supply of power source can be increased. Therefore, the LED chip can generate high light-emitting efficiency.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure with a plurality of thick guiding pins, comprising:

a plurality of conductive pins separated from each other by non-conductive areas, each of said plurality of conductive pins having first and second opposite ends, a top surface, and a bottom surface contoured with a concave groove;

an insulative casing covering said bottom side and leaving said top surface of each of said plurality of conductive pins exposed, wherein said insulative casing includes a pair of side walls extending between a lower portion and an upper edge thereof and defining an injection concave groove therebetween, wherein said lower portion of said insulative casing fills said non-conductive areas and said concave grooves formed on said bottom surfaces of said plurality of pins, wherein said first and second opposite ends of said each conductive pin extend external to said insulative casing through said pair of side walls thereof, and wherein at least said first end of said each conductive pin extends a predetermined length beyond a respective one of said pair of side walls of said insulative casing;

a plurality of LED chips, each arranged on said top surface of a respective one of said plurality of conductive pins in said injection concave groove, wherein said each LED chip has a positive electrode side and a negative electrode side electrically connected with respective conductive pins; and a packaging colloid material filled into the injection concave groove for covering said plurality of LED chips.

2. The LED chip package structure as claimed in claim 1, wherein said each conductive pin has an electroplated protection layer formed on a surface thereof.

3. The LED chip package structure as claimed in claim 1, wherein said each conductive pin has a thickness between 0.4 mm and 3 mm.

4. The LED chip package structure as claimed in claim 1, wherein the insulative casing is filled into said non-conductive areas, each defined between neighboring of said plurality of conductive pins.

5. The LED chip package structure as claimed in claim 1, wherein the packaging colloid material includes a material selected from a group consisting of an epoxy material and a silicone material.

* * * * *